(12) United States Patent
Kurihara et al.

(10) Patent No.: US 7,326,989 B2
(45) Date of Patent: Feb. 5, 2008

(54) THIN FILM CAPACITOR AND ITS MANUFACTURE METHOD

(75) Inventors: Kazuaki Kurihara, Kawasaki (JP); Takeshi Shioga, Kawasaki (JP); John David Baniecki, Kawasaki (JP)

(73) Assignee: FUJITSU Limited, Kawasaki (JP)

( * ) Notice: Subject to any disclaimer, the term of this patent is extended or adjusted under 35 U.S.C. 154(b) by 181 days.

(21) Appl. No.: 11/066,540

(22) Filed: Feb. 28, 2005

(65) Prior Publication Data

US 2005/0142733 A1    Jun. 30, 2005

Related U.S. Application Data

(63) Continuation of application No. PCT/JP03/10392, filed on Aug. 15, 2003.

(30) Foreign Application Priority Data

Aug. 29, 2002 (JP) ............................. 2002-251267

(51) Int. Cl.
*H01L 29/94* (2006.01)
*H01L 21/44* (2006.01)

(52) U.S. Cl. .................... 257/310; 438/607

(58) Field of Classification Search ............... 438/153, 438/240, 384, 607; 257/306, 310, 332, 774
See application file for complete search history.

(56) References Cited

U.S. PATENT DOCUMENTS

| | | | |
|---|---|---|---|
| 5,387,459 A | 2/1995 | Hung | |
| 5,745,335 A | 4/1998 | Watt | |
| 5,776,621 A | 7/1998 | Nashimoto | |
| 5,919,515 A | 7/1999 | Yano et al. | |
| 6,060,735 A * | 5/2000 | Izuha et al. | ............. 257/295 |
| 6,291,292 B1 * | 9/2001 | Yang | ............. 438/241 |
| 6,316,797 B1 * | 11/2001 | Van Buskirk et al. | ...... 257/295 |
| 2001/0006254 A1 | 7/2001 | Li | |

FOREIGN PATENT DOCUMENTS

| | | |
|---|---|---|
| JP | 05-343639 | 12/1993 |
| JP | 6-196648 | 7/1994 |
| JP | 6-236988 | 8/1994 |
| JP | 9-63991 | 3/1997 |
| JP | 10-270653 | 10/1998 |

(Continued)

OTHER PUBLICATIONS

Notice of Argument Submission (Excerpt) dated Sep. 22, 2006, issued in corresponding Korean Patent Application No. 10-2005-7003132.

*Primary Examiner*—Calvin Lee
(74) *Attorney, Agent, or Firm*—Westerman, Hattori, Daniels & Adrian LLP.

(57) ABSTRACT

A thin film capacitor is provided which includes a single crystal high dielectric constant dielectric layer. The thin film capacitor has a single crystal silicon substrate, a single crystal intermediate layer epitaxially grown on the single crystal silicon substrate, a single crystal lower electrode epitaxially grown on the single crystal intermediate layer, a single crystal high dielectric constant dielectric layer epitaxially grown on the lower electrode layer, an upper electrode layer formed above the single crystal high dielectric constant dielectric layer, and a plurality of conductor terminals connected to the lower electrode layer and upper electrode layer at a plurality of positions.

12 Claims, 8 Drawing Sheets

FOREIGN PATENT DOCUMENTS

| | | |
|---|---|---|
| JP | 11-97289 | 4/1999 |
| JP | 2000-8942 | 1/2000 |
| JP | 2000-306730 | 11/2000 |
| JP | 2001-85624 | 3/2001 |
| JP | 2001-181089 | 7/2001 |
| JP | 2001-518673 | 10/2001 |
| KR | 2001-0112236 A | 12/2001 |
| KR | 2001-0112262 A | 12/2001 |
| WO | WO 00/41232 | 7/2000 |
| WO | WO 00/52743 | 9/2000 |

\* cited by examiner

THIN FILM CAPACITOR AND ITS MANUFACTURE METHOD

CROSS REFERENCE TO RELATED APPLICATION

This application is a continuation application of an International patent application PCT/JP03/10392, filed on Aug. 15, 2003, which is based upon and claims the benefit of priority of Japanese patent application 2002-251267, filed on Aug. 29, 2002, the entire contents of both of which are incorporated herein by reference.

BACKGROUND OF THE INVENTION

A) Field of the Invention

The present invention relates to a capacitor, and more particularly to a capacitor of low inductance and large capacitance suitable for being used as a decoupling capacitor for absorbing noises generated in a large scale integrated circuit (LSI) operating at a high frequency.

In the present specification, a relative dielectric constant of 10 or larger is called a high dielectric constant.

B) Description of the Related Art

A capacitor is an important constituent element in a large scale integrated circuit (LSI) operating at a high frequency. For example, a method of lowering a power source impedance has been used by which a noise absorbing decoupling capacitor is connected in parallel with a power source to avoid malfunction to be caused by switching noises and the like.

A power source impedance Z is expressed by:

$$Z(P) \propto V/(nif) \quad (1)$$

where "V" is a power source voltage, "n" is the number of elements per LSI, "i" is a switching current of an element, and "f" is an operation frequency.

A requested power source impedance is rapidly lowering because of the demands for lower voltage drive, higher integration of elements and higher frequency of LSI. An impedance Z(C) of a decoupling capacitor is expressed by:

$$Z(C) = [R^2 + \{2\pi f L - (1/2\pi f C)\}^2]^{1/2} \quad (2)$$

where R is a resistance, L is an inductance, and C is a capacitance. It is desired that the capacitance C is increased and the inductance L is reduced in order to lower the impedance of a decoupling capacitor.

As a decoupling capacitor, laminated ceramic capacitors disposed around an LSI are generally used. A laminated ceramic capacitor has the structure that an electrode layer and a ceramic dielectric layer are alternately laminated and a pair of surface electrodes is formed in the sides of the capacitor and each surface electrode is connected to every second electrode layers. Although a large capacitance can be obtained, it is not easy to reduce inductance because the electrode layers are connected to the surface electrodes at the sides of the electrode layers.

As the operation frequency of LSI becomes high, a decoupling capacitor is required to have a low inductance. However, an approach of using laminated ceramic capacitors is severe.

A thin film capacitor is being developed as a low inductance capacitor. A thin film capacitor is formed in the following manner. For example, on a silicon substrate, electrode layers and a dielectric layer are formed, openings are formed selectively to an electrode layer, and a number of lead electrodes are formed connected to the electrode layer through the dielectric layer in a thickness direction via the openings. Solder bumps, for example, are formed on the lead electrodes to allow surface mount of the thin film capacitor. Since the distance between a terminal and each electrode point can be shortened, it is effective for reducing inductance. Since semiconductor manufacture processes can be used, size precision can be made high and a bump pitch can be shortened.

A dielectric thin film of a thin film capacitor can be made thin easily, which is advantageous in that capacitance per unit area of an electrode can be increased. If there is any defect in a thin dielectric layer, leak current is likely to increase. As compared with a laminated ceramic capacitor, it is more difficult to form a thin film capacitor of a multilayer structure. A thin dielectric film tends to lower its dielectric constant. Under these circumstances, it is not easy to form a thin film capacitor of large capacitance, as compared with a laminated ceramic capacitor.

Japanese Patent Laid-open Publication No. HEI-11-97289 proposes to form a dielectric layer by two processes using a sol-gel method. A second film forming process uses sol-gel source material having a low density. It reports that leak current can be reduced about one third by improving the quality of a polycrystalline dielectric layer.

The dielectric layer of a thin film capacitor has preferably a high dielectric constant. The higher the dielectric constant, the larger the capacitance of a capacitor having the same thickness and area. BaSrTiO$_3$(BST) is often used as the material of a high dielectric constant dielectric layer. BST has a high dielectric constant, a low loss and a high breakdown voltage, providing excellent characteristics of stability and high frequency performance.

Figure 7:
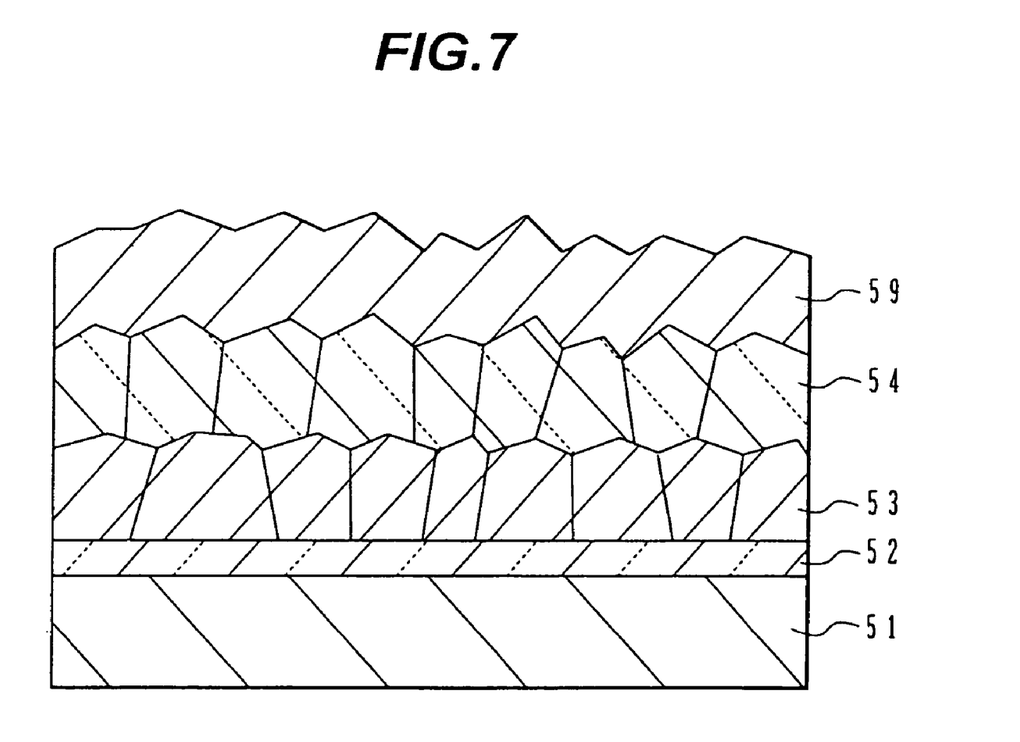
FIG. 7 is a cross sectional view showing the structure of a thin film capacitor according to prior art.

FIG. 7 shows an example of the structure of a thin film capacitor according to prior art. An insulating layer 52 of silicon oxide or the like is formed on the surface of a silicon substrate 51. On the insulating layer 52, a lower electrode 53 of Pt or the like is formed, and on the lower electrode 53, a high dielectric constant dielectric layer 54 of BST or the like is formed. On the dielectric layer 54, an upper electrode 59 or the like is formed.

The lower electrode 53 formed on the insulating layer 52 is generally polycrystalline. The high dielectric constant layer 54 formed on the polycrystalline lower electrode 53 becomes also polycrystalline. The polycrystalline dielectric layer 54 contains a number of grains and a grain boundary is formed between grains. Leak current is likely to flow through a grain boundary, and deteriorates the leak characteristics of the dielectric layer, i.e., its breakdown voltage.

If each polycrystalline grain forms a surface in conformity with the crystal habit boundary, surface smoothness of the dielectric layer 54 is lost. As the surface of the dielectric layer becomes more irregular, the uniformity of an electric field is degraded and an electric field concentration occurs, resulting also in deterioration of the leak characteristics or breakdown voltage.

If a dielectric layer made of a flat surface single crystal layer can be formed, it is possible to provide a thin film capacitor excellent in leak characteristics and breakdown voltage.

On a single crystal MgO substrate or single crystal SrTiO$_3$(ST) substrate, a high dielectric constant dielectric layer of a perovskite structure can be formed. However, it is difficult to form such a single crystal substrate which is inexpensive and has a large area.

Figure 8A:
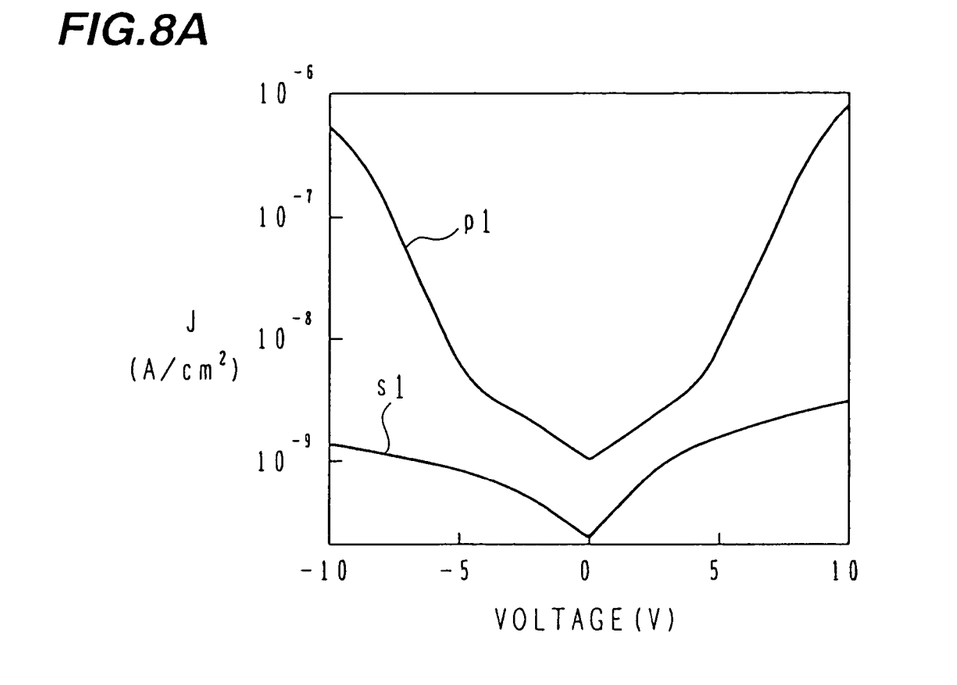
FIGS. 8A and 8B are graphs showing the characteristics of a capacitor using a single crystal dielectric layer as compared with the characteristics of a capacitor using a polycrystalline dielectric layer.
Figure 8B:
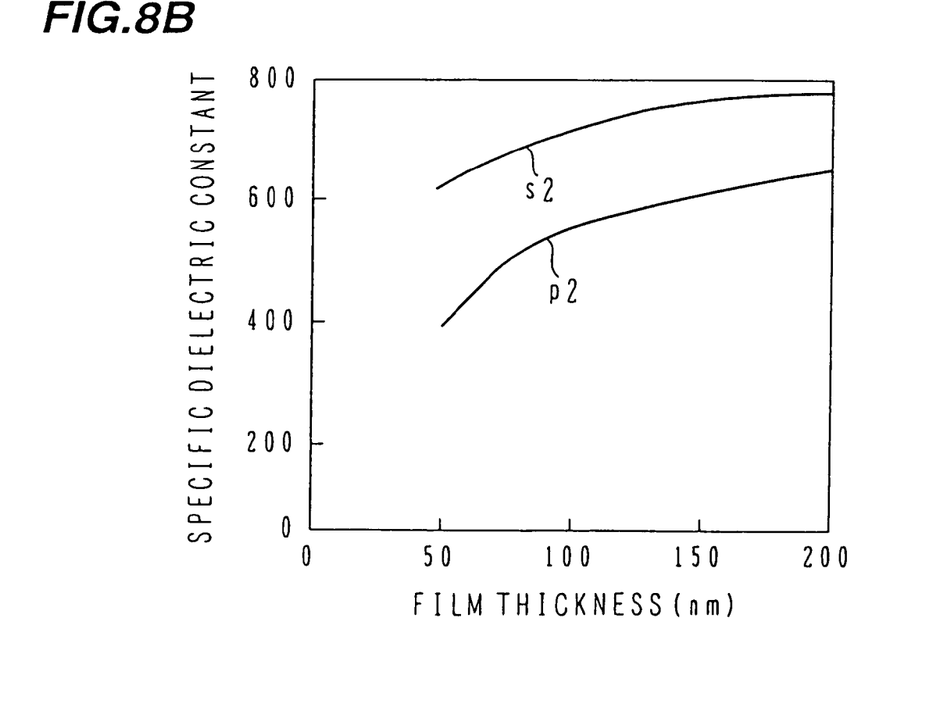

FIGS. 8A and 8B are graphs showing expected characteristics of a thin film capacitor using a single crystal dielectric layer.

FIG. 8A is a graph showing the leak characteristics of a thin film capacitor using a single crystal dielectric layer, as compared with a thin film capacitor using a polycrystalline dielectric layer. The abscissa represents a voltage applied to the capacitor in the unit of V in a linear scale, and the ordinate represents a leak current in the unit of $A/cm^2$ in logarithmic scale. A curve p1 shows the leak characteristics of the thin film capacitor using a polycrystalline dielectric layer, and a curve p2 shows the leak characteristics of the thin film capacitor using a single crystal dielectric layer. As shown, it is expected that a leak current reduces considerably as grain boundaries are extinguished, i.e. when a single crystal dielectric layer is used.

FIG. 8B is a graph showing dependency of dielectric constant upon single crystal dielectric layer thickness as compared with dependency of dielectric constant upon polycrystalline dielectric layer thickness. The abscissa represents film thickness in the unit of nm in linear scale, and the ordinate represents specific dielectric constant in linear scale. A curve p2 shows a dependency of a dielectric constant upon polycrystalline dielectric film thickness. The polycrystalline dielectric layer greatly lowers its dielectric constant as the film thickness becomes 100 nm or thinner.

A curve s2 shows a dependency of dielectric constant upon single. crystal dielectric layer. The dielectric constant of single crystal dielectric layer is as a whole higher than that of a polycrystalline dielectric layer. Although the dielectric constant of the single crystal dielectric layer lowers as it becomes thinner, it is expected that the dielectric constant will not lower greatly as in the case of the polycrystalline dielectric layer.

As described above, thin film capacitors have been manufactured conventionally by using polycrystalline dielectric layers. If a polycrystalline dielectric layer can be replaced with a single crystal dielectric layer, the characteristics of a thin film capacitor can be improved considerably.

SUMMARY OF THE INVENTION

It is an object of the present invention to provide a thin film capacitor with a single crystal high dielectric constant dielectric layer.

Another object of the present invention is to provide a thin film capacitor of low inductance and high capacitance suitable for use in reducing power source noises and the like of a large scale integrated circuit operating at a high frequency.

Still another object of the present invention is to provide a manufacture method for such a thin film capacitor.

According to one aspect of the present invention, there is provided a thin film capacitor comprising: a single crystal silicon substrate; a single crystal intermediate layer epitaxially grown on the single crystal silicon substrate; a single crystal lower electrode epitaxially grown on the single crystal intermediate layer; a single crystal high dielectric constant dielectric layer epitaxially grown on the lower electrode layer; an upper electrode layer formed above the single crystal high dielectric constant dielectric layer; and a plurality of conductor terminals connected to the lower electrode layer and upper electrode layer at a plurality of positions.

According to another aspect of the present invention, there is provided a manufacture method for a thin film capacitor, comprising the steps of: epitaxially growing an intermediate layer on a surface of a single crystal silicon substrate; epitaxially growing a lower electrode layer on the intermediate layer; epitaxially growing a single crystal high dielectric constant dielectric layer on the lower electrode layer; and forming an upper electrode layer above the single crystal high dielectric constant dielectric layer.

DESCRIPTION OF THE PREFERRED EMBODIMENTS

The present inventors have found that a single crystal lower electrode and a single crystal dielectric layer can be formed on a single crystal silicon substrate.

Figure 1A:
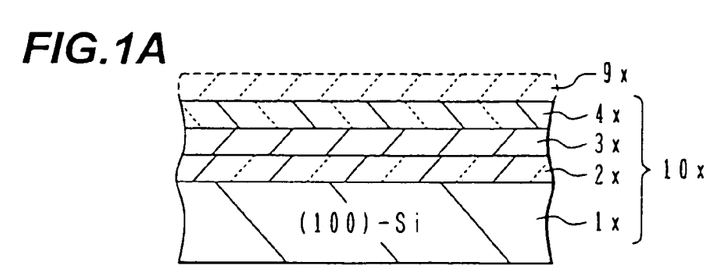
FIGS. 1A to 1D are a cross sectional view, diagrams and a graph illustrating the results of experiments made by the present inventors.

FIG. 1A shows the structure of a sample. A silicon substrate 1x is prepared having the (100) plane. An $SrTiO_3$ film 2x of about 100 nm in thickness to be used as an intermediate layer of insulating material is formed on the (100) plane of the silicon substrate by RF sputtering in an $Ar/O_2$ atmosphere containing Ar and $O_2$ at a substrate temperature of 800° C., by using an $SrTiO_3$ sputtering target.

A Pt layer 3x of about 500 nm to be used as a lower electrode layer is formed on the intermediate layer 2x by DC sputtering in an Ar atmosphere at a substrate temperature of 600° C., and on the Pt layer 3x, a $BaSrTi_3$ layer 4x of about 50 nm in thickness made of high dielectric constant perovskite oxide is formed by RF sputtering in an $Ar/O_2$ atmosphere. A sample 10x was formed in this manner and it was verified through X-ray analysis whether the dielectric layer 4x is single crystal. If the dielectric layer 4x of this structure is single crystal, a thin film capacitor having a single crystal dielectric layer can be formed by merely forming an upper electrode 9x on the dielectric layer.

Figure 1B:
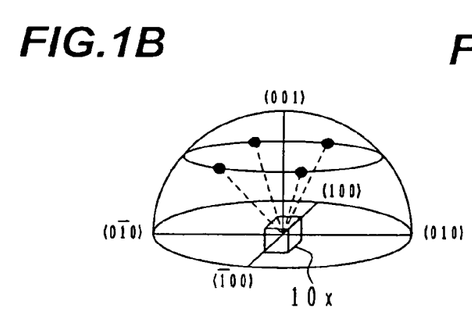

FIG. 1B is a semisphere diagram showing a polar point pattern of each constituent layer of the sample 10x. There are shown a substrate normal direction <001>, an in-plane direction <100> and their equivalent directions respectively of the sample 10x. Diffraction directions in the (110) planes distribute as indicated by black points.

Figure 1C:
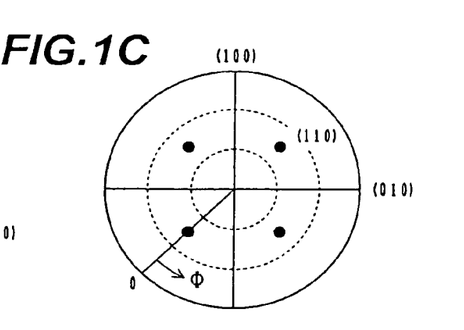

FIG. 1C is a diagram of the semisphere of FIG. 1B as viewed from above. Diffraction peaks in an equivalent (110) plane are distributed at four positions by an interval of 90 degrees. These directions can be detected by φ scan.

Figure 1D:
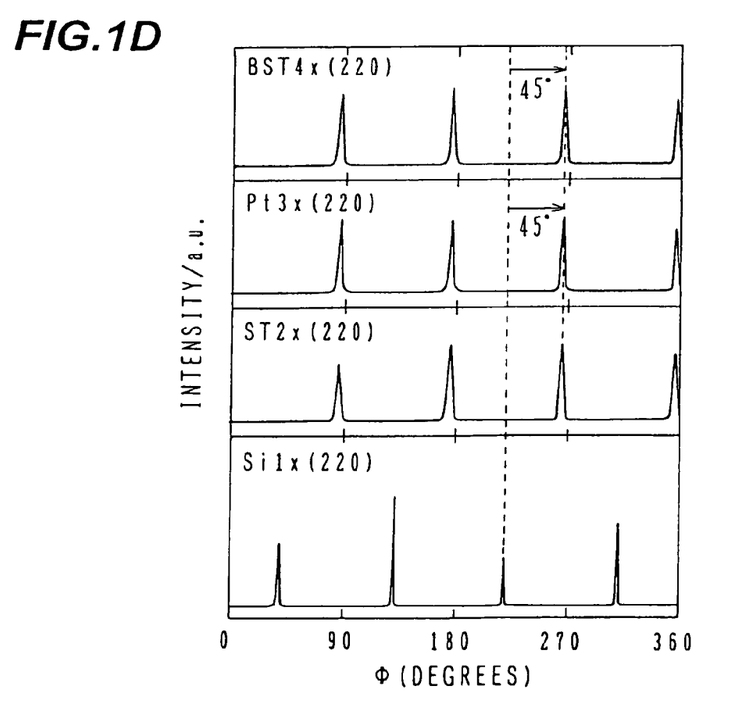

FIG. 1D is a graph showing a φ scan x-ray diffraction intensity. The abscissa represents an angle φ in the unit of degree, and the ordinate represents an X-ray diffraction intensity. Measured diffraction peaks in a (220) plane of the silicon substrate 1x have an interval of 90 degrees. The intermediate layer 2x, lower electrode layer 3x and dielectric layer 4x formed on the substrate have clear (220) plane diffraction patterns at the same positions. The (220) diffraction pattern of the silicon substrate is shifted by 45 degrees from that of each thin film layer formed thereon. This is because Si and $SrTiO_3$ have different lattice constants and lattice matching is obtained in the state that ST is rotated by 45 degrees.

It can be understood from the results shown in FIG. 1D that a strontium titanate oxide (ST) layer, a platinum layer and a BST layer can be epitaxially grown sequentially on the surface of a (100) plane of an Si substrate.

FIGS. 2A to 2D show the experiment results when a (111) plane silicon substrate is used.

Figure 2A:
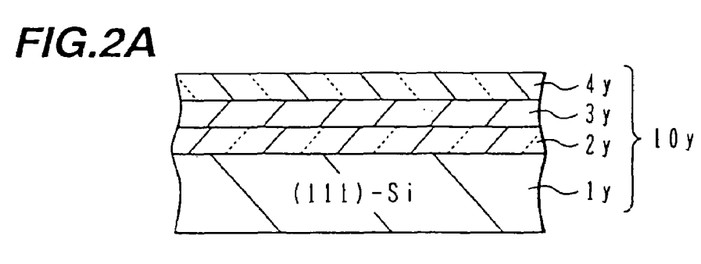
FIGS. 2A to 2D are a cross sectional view, diagrams and a graph illustrating the results of experiments made by the present inventors.

FIG. 2A shows the structure of a sample. Deposited on the surface of a (111) plane silicon substrate 1y are a $CeO_2$ layer 2y of about 100 nm in thickness formed by RF sputtering in an $Ar/O_2$ atmosphere at a substrate temperature of 800° C., a Pt layer 3y of about 500 nm in thickness formed on the layer 2y by DC sputtering in an Ar atmosphere at a substrate temperature of 600° C., and a BST layer 4y of about 50 nm in thickness formed on the layer 3y by RF sputtering in an $Ar/O_2$ atmosphere at a substrate temperature of 600° C. A sample 10y formed in this manner was analyzed by using X-ray.

Figure 2B:
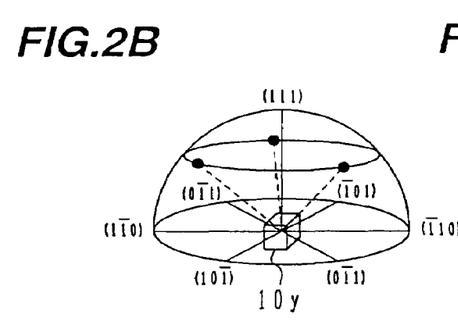

FIG. 2B is a diagram showing a polar point pattern of each constituent layer measured with X-ray. There are shown on the semisphere a substrate normal direction <111>, an in-plane direction <10-1> and its equivalent direction respectively of the silicon substrate. Diffraction directions in the (110) plane are indicated by black points.

Figure 2C:
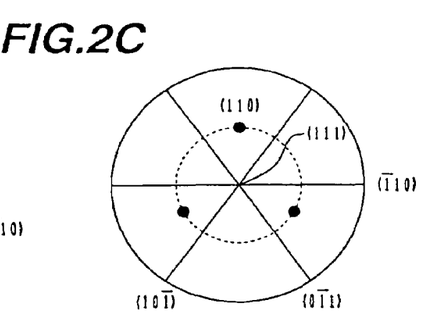

FIG. 2C is a diagram of the semisphere of FIG. 2B as viewed from above. Diffraction peaks in a (110) plane appear at the middle positions of the <10-1> direction.

Figure 2D:
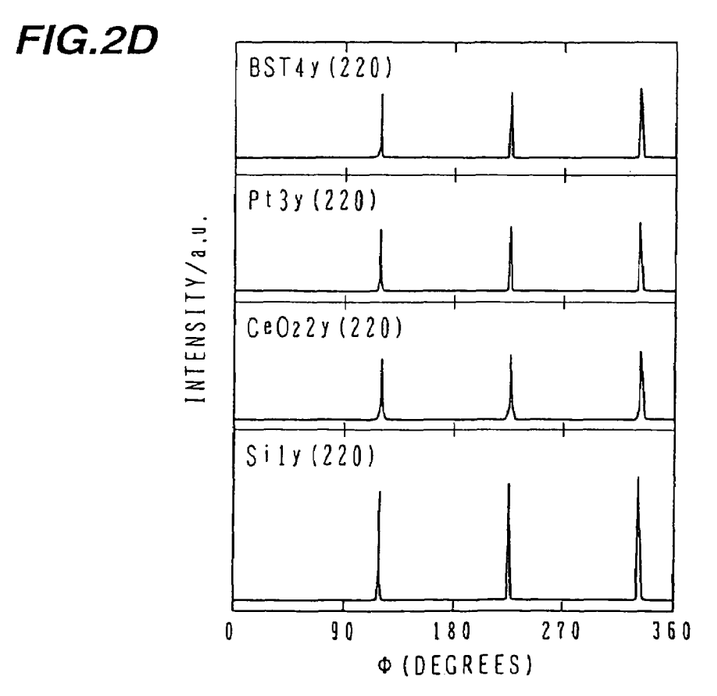

FIG. 2D is a graph showing a φ scan pattern of the sample. The abscissa represents an angle φ in the unit of degree, and the ordinate represents an X-ray diffraction intensity in an arbitrary unit. The silicon substrate 1y, $CeO_2$ layer 2y, Pt layer 3y and BST layer 4y each have a diffraction pattern at the same position on the (220) plane. It can therefore be understood that the $CeO_2$ layer 2y, Pt layer 3y and BST layer 4y formed on the (111) silicon substrate are each a single crystal layer having the same crystal axis as that of the substrate.

It can be understood from these experiment results that insulating intermediate layers of $SrTO_3$ and $CeO_2$ can be epitaxially grown on a single crystal silicon substrate and that on the intermediate layers, a noble metal lower electrode layer of Pt and a high dielectric constant perovskite dielectric layer of $BaSiTiO_3$ can be epitaxially grown.

In other words, it is possible to epitaxially grow an intermediate layer on a single crystal silicon substrate and epitaxially grow a lower electrode and a dielectric layer on the intermediate layer in succession.

As the material of the intermediate layer capable of being epitaxially grown on a silicon substrate, oxide such as $ZrO_2$, $MgAl_2O_4$ and nitride such as TiAlN may be used in addition to $CeO_2$ of the fluorite structure and $SrTiO_3$ of perovskite structure described above.

As the material of a single crystal lower electrode, noble metal such as Ir, Ru, and Rh may be used in addition to Pt described above. The noble metal such as Ir, Ru and Rh is suitable for the electrode material because they have a lower resistivity than that of Pt. However, they have the properties of being oxidized. If oxidation is to be prevented, it is preferable to use Pt. Conductive oxide such as $SrRuO_3$, $LaNiO_3$ and $LaSrCO_3$ and conductive nitride such as AlTiN may also be used.

As the material of a high dielectric constant dielectric layer being able to be epitaxially grown and having a relative dielectric constant of 10 or higher, in addition to (Ba, Sr)$TiO_3$ (BST) described above, perovskite type oxide can be used, such as $SrTiO_3$(ST), $BaTiO_3$, Ba(Zr, Ti)$O_3$, Ba(Ti, Sn)$O_3$, Pb(Zr, Ti)$O_3$(PZT), (Pb, La)(Zr, Ti)$O_3$(PLZT), Pb(Mn, Nb)$O_3$—PbTiO$_3$(PMT-PT) and Pb(Ni, Nb)$O_3$—PbTiO$_3$.

Instead of forming a pair of electrodes sandwiching a single dielectric layer, the structure of a plurality of dielectric layers sandwiched between a pair of electrodes may also be used. The structure that an electrode is inserted between dielectric layers may also be used. The electrode inserted between dielectric layers is made of material similar to that of the lower electrode so as to allow it to be epitaxially grown.

The upper electrode is not necessarily single crystal, but it may be made of material similar to that of the lower electrode, conductive material such as Au, Cu and Al, their alloy, composite material containing other material or the like.

Embodiments of the present invention will be described.

FIGS. 3A to 3E are cross sectional views of an Si substrate illustrating the manufacture processes for a thin film capacitor according to an embodiment of the invention.

Figure 3A:
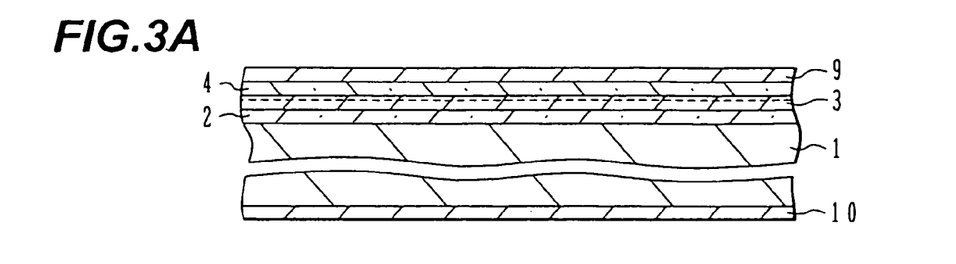
FIGS. 3A to 3E are cross sectional views of a silicon substrate illustrating manufacture processes for a thin film capacitor according to an embodiment of the present invention.

As shown in FIG. 3A, a (111) silicon substrate 1 is set in a multi-target, DC-RF magnetron sputtering system, and a substrate temperature is set to 800° C. $CeO_2$ is sputtered on the substrate from a $CeO_2$ target in an $Ar/O_2$ atmosphere by using an RF power source to thereby form an intermediate layer 2 of about 100 nm in thickness. The intermediate layer 2 is epitaxially grown in conformity with the crystal orientation of the substrate 1 to form a (111) plane.

At a substrate temperature of 600° C., a PT layer 3 is grown to a thickness of about 500 nm by using a Pt target and a DC power source in an Ar atmosphere. The Pt lower electrode layer 3 epitaxially grows in conformity with the orientation of the $CeO_2$ intermediate layer 2. By maintaining the substrate temperature at 600° C., a $BaSiTiO_3$ layer 4 is grown to about 50 nm in thickness by sputtering in an $Ar/O_2$ atmosphere by using a $BaSrTiO_3$ target and an RF power source. The $BaSrTiO_3$ layer 4 is also epitaxially grown.

Next, at a substrate temperature of 300° C., A Pt layer 9 of about 500 nm in thickness is formed on the substrate by using a Pt target and a DC. power source in an Ar atmosphere. Since the Pt upper electrode layer 9 is not necessary to have particular orientation, it is formed at a low temperature.

The substrate is turned over and set in the sputtering system. A Cr layer 10 is formed on the bottom of the substrate to about 500 nm in thickness at a substrate temperature of 300° C. This Cr layer 10 prevents the substrate from being warped.

Figure 3B:
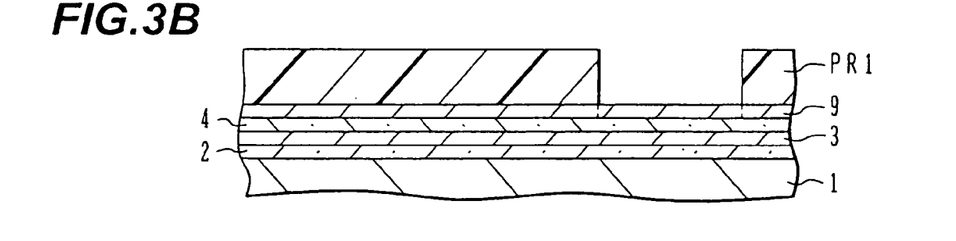

As shown in FIG. 3B, a resist pattern PR1 is formed on the upper electrode layer 9, having an opening corresponding to the region where the upper electrode is removed. By using the resist pattern PR1 as a mask, the upper electrode 9 is patterned by milling. The resist pattern PR1 is thereafter removed and post annealing is performed at 500° C. in an $O_2$ atmosphere.

Figure 3C:
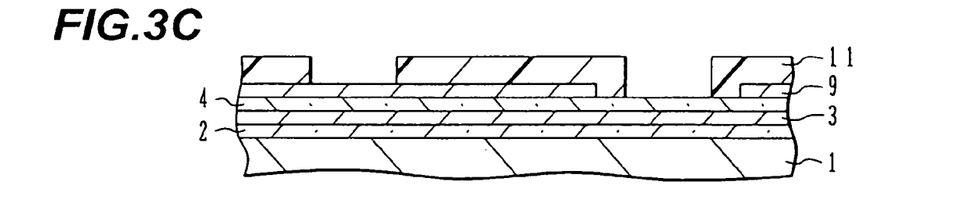

As shown in FIG. 3C, a photosensitive polyimide layer 11 is formed on the patterned upper electrode 9, exposed and developed to form openings corresponding to the regions where lower and upper electrode leads are formed.

Figure 3D:
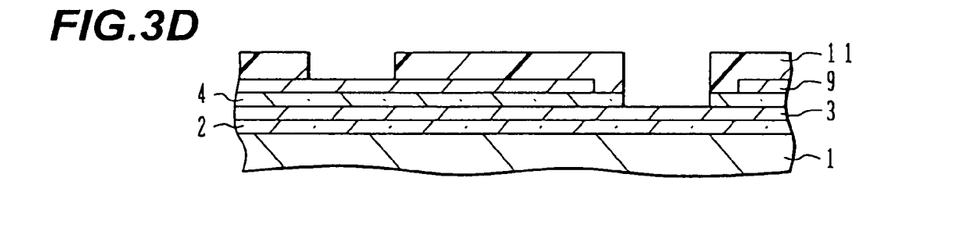

As shown in FIG. 3D, by using the polyimide layer 11 as a mask, the dielectric layer 4 is etched. The lower electrode 3 is exposed by etching and removing the dielectric layer 4 in the region where the lower electrode lead is formed.

Figure 3E:
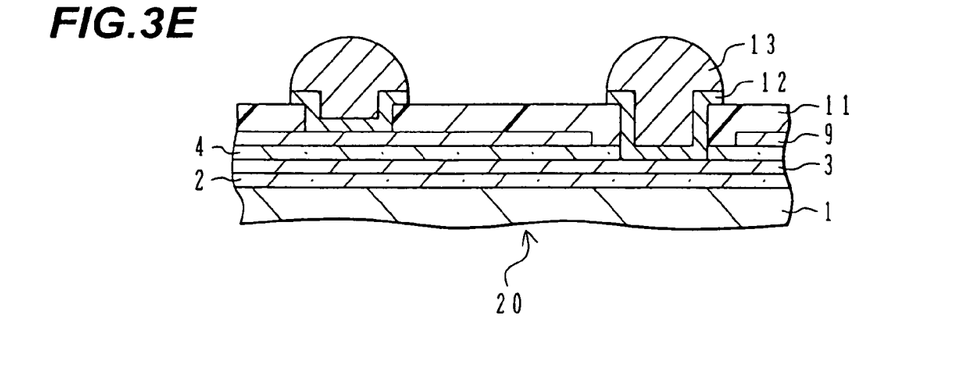

As shown in FIG. 3E, an Au/Ni/Cr lamination layer is deposited and patterned to form an electrode pad 12. A solder bump 13 is formed on the electrode pad 12.

Although only one bump for the lower electrode and only one bump for the upper electrode are shown, a number of bumps are formed for the thin film capacitor, and the upper and lower electrodes are connected to bumps at a number of positions.

In the embodiment described above, a (111) silicon substrate is used as the silicon substrate, a $CeO_2$ layer is used as the intermediate layer, and a Pt layer is used as the lower electrode. This is not limitative but various alterations are possible. Another embodiment of the present invention will be described with reference again to FIGS. 3A to 3E.

As shown in FIG. 3A, a (100) silicon substrate 1 is set in a multi-target, DC-RF magnetron sputtering system, and a substrate temperature is set to 800° C. An $SrTiO_3$ film is formed to a thickness of about 50 nm in an $Ar/O_2$ atmosphere by using a RF power source. The $SrTiO_3$ film as an intermediate layer 2 is epitaxially grown.

Next, a substrate temperature is set to 600° C. An Ir layer is formed to a thickness of about 200 nm and then a Pt layer is formed to a thickness of about 50 nm, in an Ar atmosphere by using a DC power source. An Ir/Pt lamination layer as a lower electrode 3 is therefore formed. By maintaining the substrate temperature at 600° C., a BST layer 4 is grown to about 50 nm in thickness in an $Ar/O_2$ atmosphere by using an RF power source. At a lowered substrate temperature of 300° C., a Pt layer is formed to a thickness of about 500 nm in an Ar atmosphere by using a DC power source.

In this embodiment, a (100) silicon substrate is used as the silicon substrate 1, an $SrTiO_3$ layer is used as the intermediate layer 2, and an Ir/Pt layer is used as the lower electrode 3. The other points are similar to the previously described embodiment.

An epitaxial layer can be grown on a (100) substrate even if a film forming temperature is lowered to that for a (111) substrate. Another embodiment will be described with reference again to FIGS. 3A to 3E.

As shown in FIG. 3A, a (100) silicon substrate is set in a multi-target DC-RF magnetron sputtering system. A substrate temperature is set to 750° C. A TiAlN layer 2 as an intermediate layer 2 is formed to a thickness of about 50 nm in an Ar atmosphere by using a RF power source. Although the TiAlN layer 2 is conductive, it has a high resistance and is insufficient for using as the lower electrode by itself.

A substrate temperature is set to 500° C. An Ir layer 3 is formed to a thickness of about 200 nm in an Ar atmosphere by using a DC power source. This Ir layer 3 takes a main roll of the lower electrode. By maintaining the substrate temperature at 500° C., a $BaSrTiO_3$ layer 4 is grown to about 50 nm in thickness in an $Ar/O_2$ atmosphere by using an RF power source. Next, at a lowered substrate temperature of 300° C., a Pt layer 9 is formed to a thickness of about 500 nm in an Ar atmosphere by using a DC power source. The substrate is turned over, and a Cr film 10 is deposited on the bottom of the substrate to a thickness of about 200 nm in an Ar atmosphere at a substrate temperature of 300° C. by using a DC power source.

In this embodiment, the intermediate layer is epitaxially grown at a substrate temperature of 750° C., and the lower electrode and dielectric layer are epitaxially grown at a substrate temperature of 500° C. The intermediate layer is made of TiAlN and the lower electrode is made of a single Ir layer. Since the lower electrode is thin, the Cr layer formed on the substrate bottom is made about 200 nm in thickness. Post annealing after opening the region where the electrode lead is formed, is executed at 450° C. in an $O_2$ atmosphere. Other points are similar to the above-described embodiments.

In this embodiment described above, the structure is adopted which sandwiches the single dielectric layer by the lower and upper electrodes. The dielectric layer may be made of a plurality of layers and three or more electrode layers may be used to form a laminated capacitor.

FIGS. 4A to 4E are cross sectional views illustrating the manufacture processes for a thin film capacitor according to another embodiment of the invention.

Figure 4A:
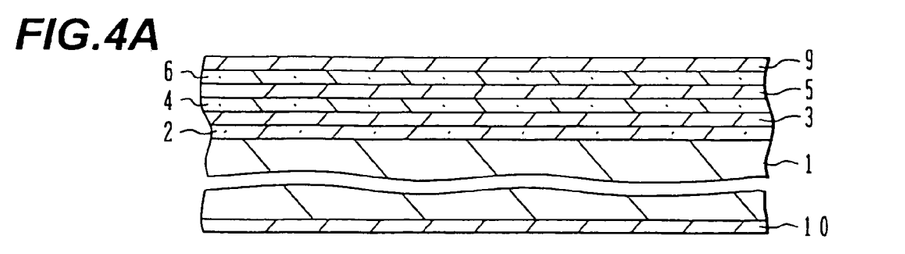
FIGS. 4A to 4E are cross sectional views of a silicon substrate illustrating manufacture processes for a thin film capacitor according to another embodiment of the present invention.

As shown in FIG. 4A, a (100) silicon substrate is set in a multi-target DC-RF magnetron sputtering system. At a substrate temperature of 800° C., an $SrTiO_3$ layer 2 as an intermediate layer 2 is formed to a thickness of about 100 nm in an $Ar/O_2$ atmosphere by using an RF power source. The $SrTiO_3$ layer is epitaxially grown on the substrate.

Next, at a substrate temperature of 600° C., a Pt layer as a lower electrode layer 3 is formed to a thickness of about 200 nm in an Ar atmosphere by using a DC power source. The Pt layer is grown epitaxially relative to the intermediate layer 2. Next, by maintaining the substrate temperature at 600° C., a BST layer as a dielectric layer 4 is formed to a thickness of about 50 nm in an $ArO_2$ atmosphere by using an RF power source. An epitaxial dielectric layer is therefore formed.

By maintaining the substrate temperature also at 600° C., a Pt layer as an intermediate electrode layer 5 is formed to a thickness of about 200 nm in an Ar atmosphere by using a DC power source. Next, by maintaining the substrate temperature at 600° C., a BST layer as a dielectric layer 6 is formed to a thickness of about 50 nm in an $Ar/O_2$ atmosphere by using an RF power source.

Next, at a substrate temperature of 300° C., a Pt layer as an upper electrode 9 is formed to a thickness of about 200 nm in an Ar atmosphere by using a DC power source. On the substrate bottom, a Cr layer 10 is formed to a thickness of about 500 nm at the substrate temperature of 300° C.

Figure 4B:
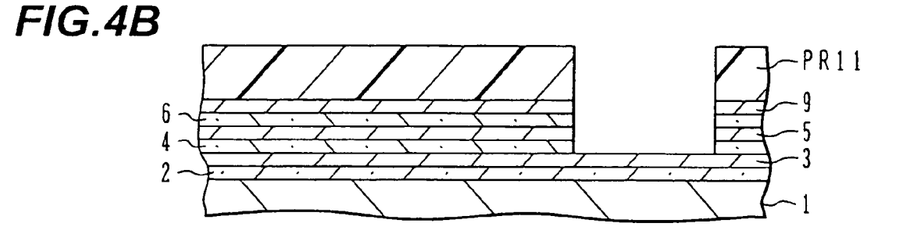

As shown in FIG. 4B, a resist pattern PR11 is formed on the upper electrode layer 9, having an opening corresponding to the lower electrode connection region. By using the resist pattern PR11 as a mask, the upper electrode 9, intermediate dielectric layer 6, intermediate electrode layer 5 and dielectric layer 4 are patterned by milling. The resist pattern PR11 is thereafter removed and post annealing in an $O_2$ atmosphere is performed.

Figure 4C:
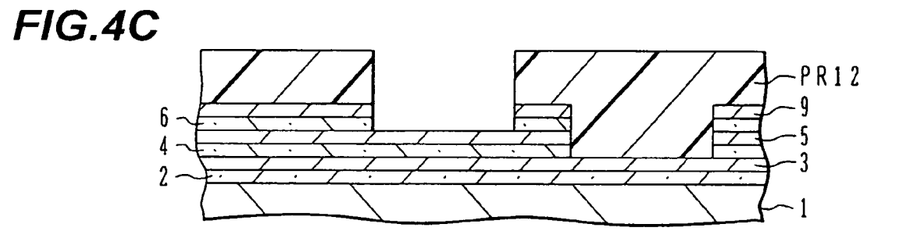

As shown in FIG. 4C, a new resist pattern PR12 is formed on the substrate, having an opening corresponding to an intermediate electrode lead region. By using the resist pattern PR12 as a mask, the upper electrode 9 and dielectric layer 6 are etched by milling to expose the intermediate electrode 5. The resist pattern PR12 is thereafter removed and post annealing is performed in an $O_2$ atmosphere.

Figure 4D:
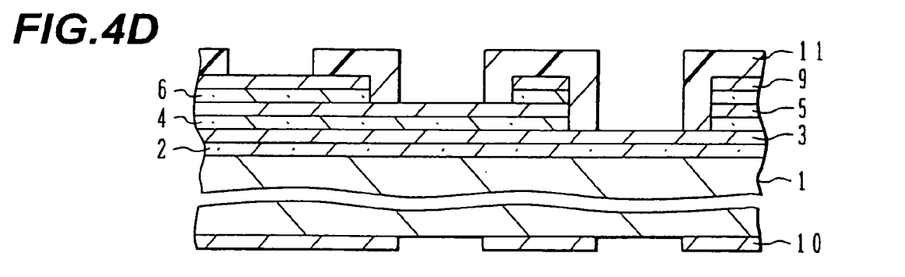

As shown in FIG. 4D, a photosensitive polyimide layer 11 is formed, exposed and developed to expose contact areas of the lower electrode 3, intermediate electrode 5 and upper electrode 9.

Figure 4E:
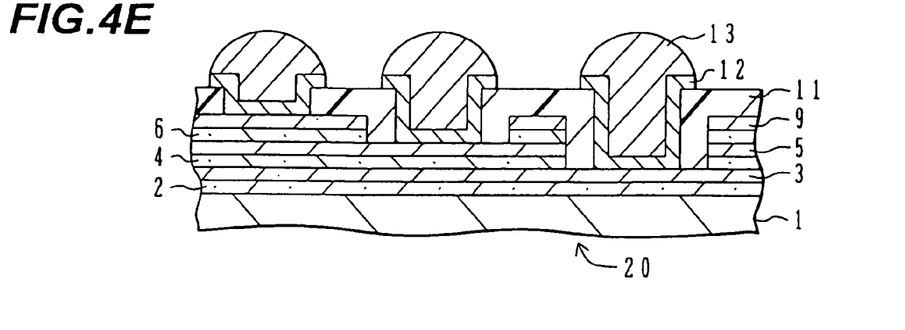

As shown in FIG. 4E, an electrode pad 12 is formed in each opening and a solder bump 13 is formed on the electrode pad 12. In this manner, a thin film capacitor 20 is formed. This structure may be used as two serially connected capacitors or two parallel connected capacitors by connecting together the upper and lower electrodes. More layers may be stacked.

Figure 5A:
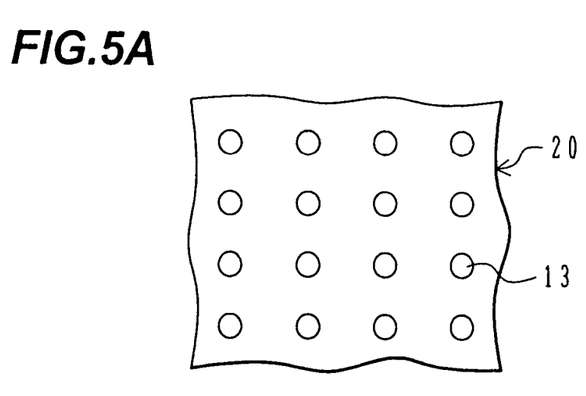
FIGS. 5A and 5B are a plan view and a cross sectional view illustrating a mount example of the thin film capacitors shown in FIGS. 3A to 3E and FIGS. 4A to 4E.

FIG. 5A shows an example of distribution of solder bumps 13 of a thin film capacitor formed in accordance with the above-described embodiment. Solder bumps 13 are formed in a matrix form on the surface of a thin film capacitor 20. The solder bumps 13 are connected regularly, for example, to the lower electrode, and upper electrode, or to the lower electrode, intermediate electrode and upper electrode. Since solder bumps are connected to each electrode layer at a plurality of positions, a thin film capacitor having a small inductance can be formed.

Figure 5B:
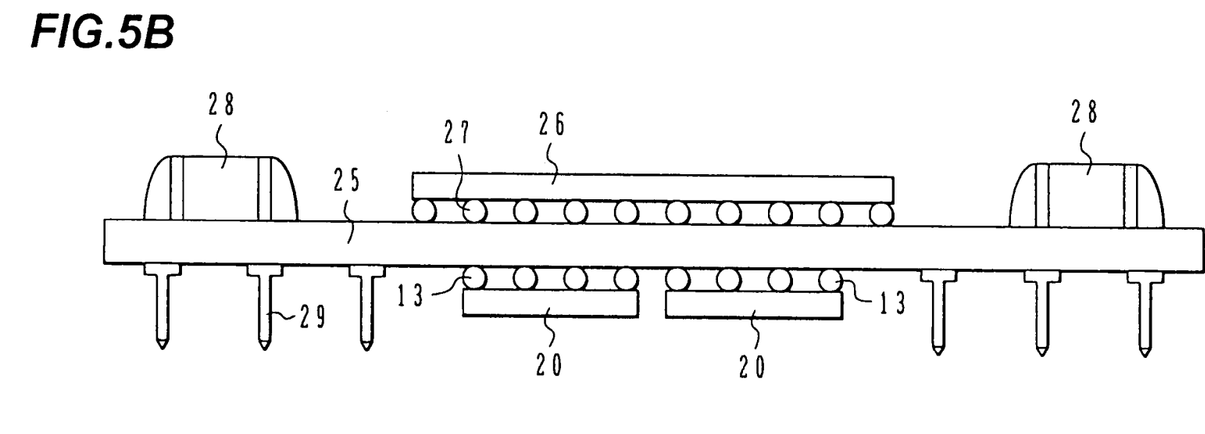

FIG. 5B is a cross sectional view wherein circuit elements are mounted on a circuit board. An LSI 26 is face-down bonded on the upper surface of the circuit board 25 by using solder bumps 27. Laminated ceramic capacitors 28 are mounted around LSI 26 and connected to power source lines of LSI.

Thin film capacitors 20 are connected to the bottom of the circuit board 25 by solder bumps 13 at positions corresponding to LSI 26. This film capacitors 20 are connected to power source lines of LSI via the solder bumps 13, conductors formed through the circuit board 25, and solder bumps 27 of LSI.

A number of pins 29 are disposed around the circuit board 25. Each pin 29 is connected to a corresponding terminal of LSI 26.

In the example described above, although a discrete thin film capacitor is used, a thin film capacitor and other elements may be integrated.

Figure 6A:
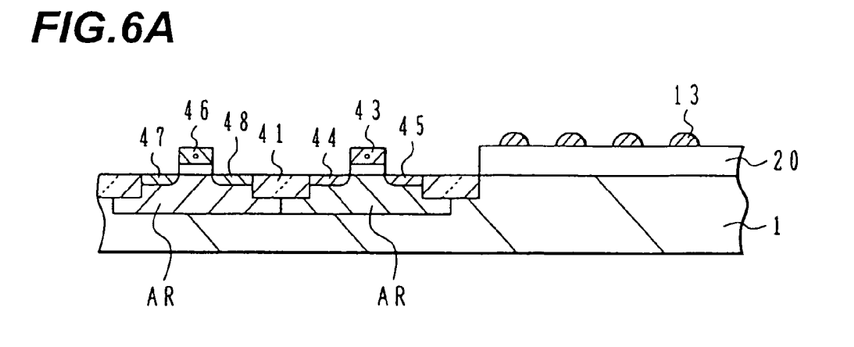
FIGS. 6A, 6B and 6C are cross sectional views showing modifications of the mount example of the present invention.

As shown in FIG. 6A, a thin film capacitor 20 is formed on partial surface of a silicon substrate 1, and lead bumps 13 are formed. In another area of the silicon substrate 1, a plurality of active regions AR are formed defined by an isolation region 41 such as shallow trench isolation. In active regions AR, gate electrode 43 and 46 are formed, and source/drain regions 44, 45, 47 and 48 are formed on both sides of the gate electrodes 43 and 46. A complementary circuit may be formed by making a pair of active regions have opposite conductivity types and making the gate electrodes 43 and 46 and the source/drain regions 44, 45, 47 and 48 have opposite conductivity types to the conductivity types of the active regions.

Figure 6B:
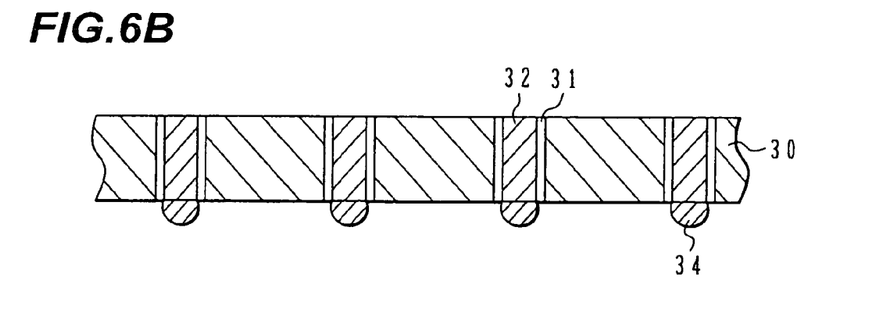

FIG. 6B shows another modification. A plurality of through holes are formed through a silicon substrate 30, an insulating layer 31 of silicon oxide or the like is formed in each through hole, and a through conductor 32 is formed burying the through hole. Bumps 34 connected to the through conductors 32 are formed on the bottom of the silicon substrate 30. With this structure, thin film capacitors can be formed on the upper surface of the silicon substrate and a circuit board or the like can be mounted on the bottom of the silicon substrate.

Figure 6C:
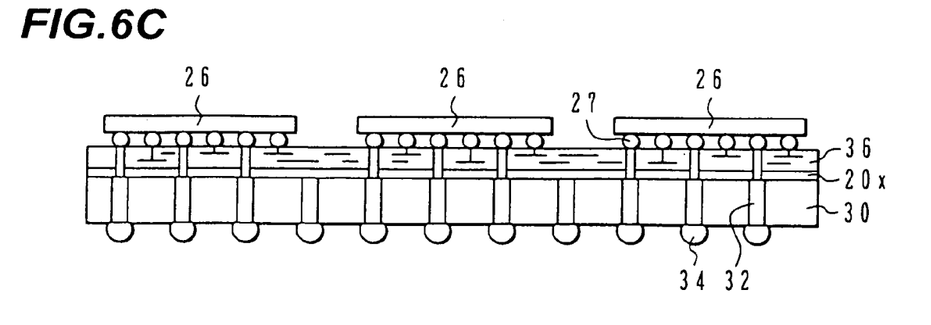

FIG. 6C shows a mount example using the structure shown in FIG. 6B. A plurality of through conductors 32 are formed through the silicon substrate 30. Thin film capacitors 20x are formed on the upper surface of the silicon substrate 30. Electrodes of thin film capacitors 20x are connected to the through conductors 32 and derived to the upper surface of the capacitors. A multilayer wiring structure 36 is formed on the thin film capacitors 20x, including resistors, inductors and the like. Solder bumps 27 are formed on the upper surface of the multilayer wiring structure 36 and connected to an LSI 26.

With this arrangement, the multilayer wiring structure 36 has bumps having a narrow pitch suitable for LSI, and bumps 34 having a broad pitch suitable for a circuit board are formed on the bottom of the silicon substrate 30. By mounting such a composite structure on a circuit board, a high density electronic circuit can be formed easily.

The present invention has been described in connection with the embodiments, and the present invention is not limited only to these embodiment.

The metal layer formed on the bottom of a silicon substrate is a layer having a thermal expansion factor larger than that of the substrate and cancelling a warp of the substrate. In addition to Cr, metal such as Ti and Ni excellent in tight adhesion to silicon may also be used.

Patterning a thin film capacitor is preferably performed after each constituent layer and a bottom layer of the capacitor are formed. If a balance is lost due to patterning and a warp becomes large, as shown in FIG. 4D at a later process the bottom layer can be etched or polished. The bottom layer may not be formed in accordance with the relation between a warp amount caused by surface layer forming and a process warp amount allowance.

In the above description, sputtering is used for forming each layer of a thin film capacitor. Instead, chemical vapor deposition (CVD), pulse laser deposition (PLD), a sol-gel method and the like may be used. Each layer may be formed by selecting a proper method from CVD, sputtering, PLD, sol-gel method and the like. In the above description, although patterning is performed after each constituent layer of a thin film capacitor is formed, forming each layer and patterning may be performed alternately. A plurality of patterning processes may be executed in the midst of film forming processes.

In the multilayer wiring structure shown in FIG. 6C, although wirings, resistors, inductors and the like are formed, via conductors, filters and the like may be formed at the same time or semiconductor elements using thin film silicon layers may be formed. Semiconductor elements can be formed on a silicon substrate as shown in FIG. 6A.

It is obvious that other modifications, improvements and combinations can be made by those skilled in the art.

INDUSTRIAL APPLICABILITY

The invention is applicable to a high frequency circuit which uses a thin film capacitor of low inductance and large capacitance. For example, the thin film capacitor can be used as a decoupling capacitor of a high speed LSI or the like.

What are claimed are:

1. A thin film capacitor comprising:
   a single crystal silicon substrate;
   a single crystal intermediate layer epitaxially grown on said single crystal silicon substrate;
   a single crystal lower electrode epitaxially grown on said single crystal intermediate layer;
   a single crystal high dielectric constant dielectric layer epitaxially grown on said lower electrode layer;
   an upper electrode layer formed above said single crystal high dielectric constant dielectric layer; and
   a plurality of conductor terminals connected to each of said lower electrode layer and upper electrode layer at a plurality of positions.

2. The thin film capacitor according to claim 1, wherein said lower electrode includes a lamination of a lower layer made of at least one selected from a group consisting of Ir, Rh and Ru and a Pt layer formed on the lower layer.

3. The thin film capacitor according to claim 1, wherein said high dielectric constant dielectric layer is made of oxide having a perovskite crystal structure.

4. The thin film capacitor according to claim 1, wherein the single crystal silicon substrate has a principal surface of a (100) plane or (111) plane.

5. The thin film capacitor according to claim 1, further comprising a lamination of at least a pair of single crystal intermediate electrode layer and single crystal intermediate high dielectric constant dielectric layer disposed on the single crystal intermediate electrode layer, said lamination layer being disposed between said single crystal high dielectric constant dielectric layer and said upper electrode layer.

6. The thin film capacitor according to claim 1, further comprising a layer formed on a bottom surface of said silicon single crystal substrate, said layer being made of a material having a thermal expansion constant larger than that of silicon.

7. The thin film capacitor according to claim 1, wherein:
said single crystal silicon substrate has through holes; and
the thin film capacitor further comprises:
through conductors formed in said through holes; and
conductive terminals connected to said through conductors.

8. The thin film capacitor according to claim 1, further comprising a multilayer thin film wiring structure formed on said upper electrode layer, said wiring structure including an insulating layer and wirings and a plurality of through conductors buried in said insulating layer.

9. The thin film capacitor according to claim 1, wherein apertures are formed through the upper electrode and the single crystal dielectric layer of the capacitor, and at least part of the conductor terminals connected to the single crystal lower electrode are derived upward through the apertures.

10. The thin film capacitor according to claim 1, wherein the single crystal intermediate layer underlies the entire single crystal lower electrode.

11. The thin film capacitor according to claim 10, wherein the single crystal intermediate layer is an insulating material.

12. The thin film capacitor according to claim 11, wherein said single crystal intermediate layer is made of at least one selected from a group consisting of $SrTiO_3$, $CeO_2$, $ZrO_2$, $MgAl_2O_4$ and TiAlN.

* * * * *